(12) United States Patent
Schierling et al.

(10) Patent No.: US 11,754,613 B2
(45) Date of Patent: Sep. 12, 2023

(54) LOCATING A GROUND FAULT IN A DC NETWORK

(71) Applicant: Siemens Aktiengesellschaft, Munich (DE)

(72) Inventors: Hubert Schierling, Erlangen (DE); Benno Weis, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 104 days.

(21) Appl. No.: 17/601,739

(22) PCT Filed: Mar. 18, 2020

(86) PCT No.: PCT/EP2020/057454
§ 371 (c)(1),
(2) Date: Oct. 6, 2021

(87) PCT Pub. No.: WO2020/207730
PCT Pub. Date: Oct. 15, 2020

(65) Prior Publication Data
US 2022/0170977 A1    Jun. 2, 2022

(30) Foreign Application Priority Data
Apr. 8, 2019  (EP) .................... 19167786

(51) Int. Cl.
*G01R 31/08*    (2020.01)
*H02H 3/04*    (2006.01)
*H02H 3/16*    (2006.01)

(52) U.S. Cl.
CPC ........... *G01R 31/086* (2013.01); *H02H 3/042* (2013.01); *H02H 3/16* (2013.01)

(58) Field of Classification Search
CPC ...... G01R 31/086; G01R 31/52; H02H 3/042; H02H 3/16; H02H 7/26
See application file for complete search history.

(56) References Cited

U.S. PATENT DOCUMENTS 11,081,872 B2    8/2021  Madelkau
2005/0231217 A1* 10/2005  Carruthers ............. G01R 31/40
                                          324/691

(Continued)

FOREIGN PATENT DOCUMENTS

DE    102017108822 A1    10/2018
EP        2860838 A1     4/2015
JP      H07325121 A     12/1995

OTHER PUBLICATIONS

PCT International Search Report and Written Opinion of International Searching Authority dated Jul. 10, 2020 corresponding to PCT International Application No. PCT/EP2020/057454 filed Mar. 18, 2020.

*Primary Examiner* — Giovanni Astacio-Oquendo
*Assistant Examiner* — Dilara Sultana
(74) *Attorney, Agent, or Firm* — Harness, Dickey & Pierce, P.L.C.

(57) ABSTRACT

A method is disclosed for locating an earth fault in a DC network, to which multiple load zones are connectable. Each load zone has two symmetrically earthed load zone lines. In an embodiment of the method, for each load zone line, a line voltage is continuously measured between a line potential, at which the load zone line lies, and an earth potential. In the event that an earth fault is detected at a main line of the DC network, the main lines are separated from both load zone lines of a load zone and the earth fault is assigned to this load zone, if a magnitude difference between the magnitudes of (Continued)

the line voltages of the two load zone lines of this load zone are not significantly reduced after separating the main lines from the load zone lines.

16 Claims, 1 Drawing Sheet

(56) References Cited

U.S. PATENT DOCUMENTS

| | | | |
|---|---|---|---|
| 2009/0147415 A1* | 6/2009 | Lazarovich | G01R 31/52 324/509 |
| 2011/0175619 A1* | 7/2011 | Bauer | B60L 50/61 324/510 |

\* cited by examiner

LOCATING A GROUND FAULT IN A DC NETWORK

PRIORITY STATEMENT

This application is the national phase under 35 U.S.C. § 371 of PCT International Application No. PCT/EP2020/057454 which has an International filing date of Mar. 18, 2020, which designated the United States of America 2020 and which claims priority to European patent application number EP 19167786.3 filed Apr. 8, 2019, the entire contents of each of which are hereby incorporated herein by reference.

FIELD

Embodiments of the present invention generally relate to a method for locating a ground fault in a DC network, to which a plurality of load zones can be connected.

BACKGROUND

A DC network which is insulated with respect to a ground potential or is grounded via a high impedance can continue to be operated in the event of a ground fault of a DC voltage potential. The ground fault itself may be easily detected during operation by measuring and evaluating the voltages between the DC voltage potentials of the DC network and a ground potential. However, it is difficult to identify that load zone connected to the DC network in which the ground fault has occurred. However, it is important to identify that load zone in which the ground fault has occurred in order to disconnect the faulty load zone and to eliminate the ground fault. In order to identify the faulty load zone, a so-called common mode current, that is to say a fault current which is the sum of the currents in the two connection lines of the load zone to the main lines of the DC network, could be measured, for example at a point at which each load zone is connected to the DC network, for example at the input of a switchgear cabinet. If one of the common mode currents differs from zero, this indicates that the ground fault has occurred in the associated load zone. The measurements of the common mode currents could be carried out permanently or manually by maintenance personnel, for example. However, such measurements are complicated in any case.

SUMMARY

At least one embodiment of the invention specifies an improved method for locating a ground fault in a DC network, to which a plurality of load zones can be connected.

At least one embodiment, according to the invention, is directed to a method and a DC network.

The claims relate to advantageous configurations of the invention.

The method according to at least one embodiment of the invention is used to locate a ground fault in a DC network, to which a plurality of load zones can be connected, wherein each load zone has two symmetrically grounded load zone lines, a first load zone line of which can be connected to a first main line of the DC network and the second load zone line of which can be connected to a second main line of the DC network. In at least one embodiment of the method, a line voltage is continuously measured for each load zone line between a line potential of the load zone line and a ground potential. If a ground fault is detected on a main line of the DC network, the main lines are disconnected from the two load zone lines of one of the load zones and the ground fault is assigned to this load zone if a magnitude difference between the magnitudes of the line voltages of the two load zone lines of this load zone does not significantly decrease after the main lines have been disconnected from the load zone lines. In this case, symmetrical grounding of the two load zone lines of a load zone is understood as meaning identical grounding of the two load zone lines which, during operation without a ground fault, keeps the line potentials of the load zone lines symmetrical around the ground potential, for example resistive-capacitive grounding of the two load zone lines by way of in each case a parallel connection of a grounding capacitor and a grounding resistor with grounding capacitors of the same capacitances and grounding resistors of the same resistance values. Furthermore, it is always assumed here and below that the DC network is insulated with respect to the ground potential or is grounded via a high impedance. The connection of a load zone line to a main line of the DC network may be direct or indirect, wherein an indirect connection may be present, for example, if the DC network has a hierarchical structure with an uppermost hierarchical level, which is directly connected to the main lines, and at least one further hierarchical level, which is connected to the main lines via the hierarchical level(s) above it.

A DC network according to at least one embodiment of invention comprises:

two main lines, a plurality of load zones each having a first load zone line, which can be connected to a first main line of the DC network via a first switch, and a second load zone line, which can be connected to the second main line of the DC network via a second switch, a measurement unit for each load zone line, which measurement unit is configured to continuously measure a line voltage between a line potential of the load zone line and a ground potential, a ground fault monitoring unit which is configured to detect ground faults on the main lines, a control unit for controlling the switches, which control unit is configured to disconnect the main lines from the two load zone lines of a load zone, if a ground fault is detected on a main line of the DC network by the ground fault monitoring unit, by opening the switches connecting the load zone lines to the main lines, and an evaluation unit for evaluating the measurement signals from the measurement units, which evaluation unit is configured to assign a ground fault detected by the ground fault monitoring unit to that load zone which has the load zone lines disconnected from the main lines if a magnitude difference between the magnitudes of the line voltages of the two load zone lines of this load zone does not significantly decrease after the main lines have been disconnected from the load zone lines.

BRIEF DESCRIPTION OF THE DRAWINGS

The above-described properties, features and advantages of this invention and the manner in which they are achieved become clearer and more distinctly comprehensible in connection with the following description of example embodiments which are explained in more detail in connection with the drawings, in which.

Mutually corresponding parts are provided with the same reference signs in the figures.

DETAILED DESCRIPTION OF THE EXAMPLE EMBODIMENTS

Figure 1:
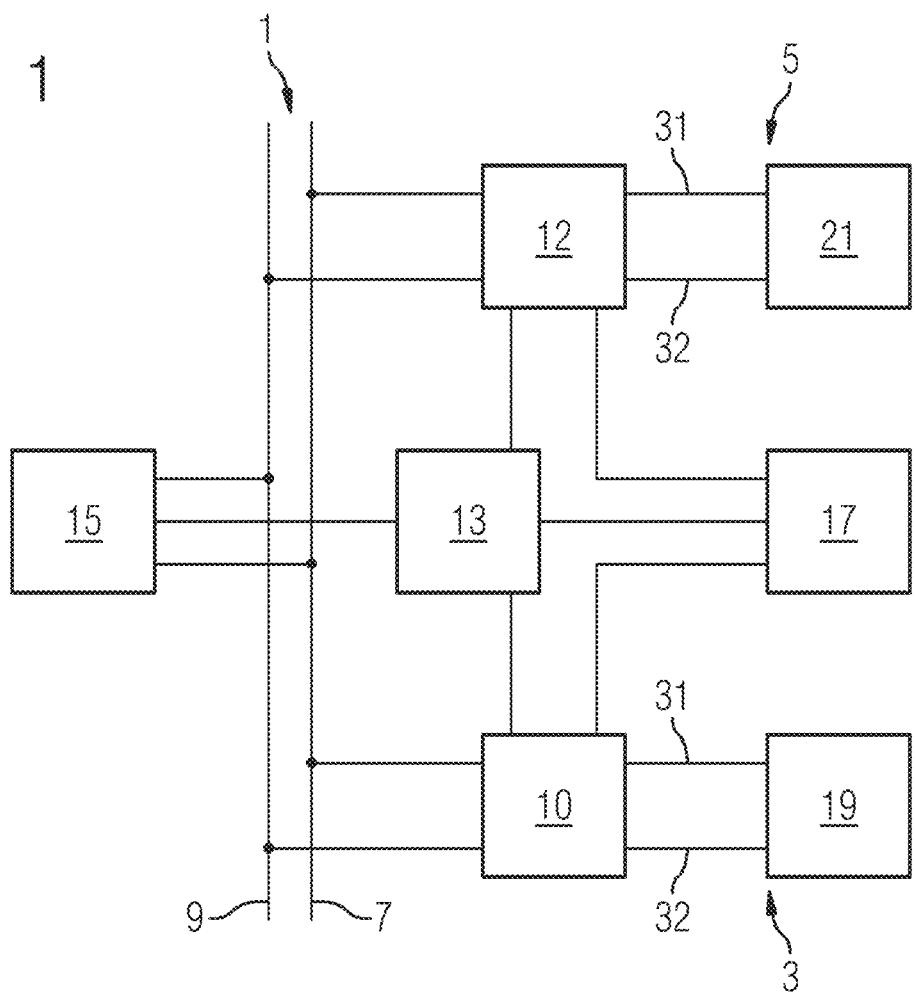
FIG. 1 shows a block diagram of a DC network, to which a plurality of load zones can be connected.

The method according to at least one embodiment of the invention is used to locate a ground fault in a DC network, to which a plurality of load zones can be connected, wherein each load zone has two symmetrically grounded load zone lines, a first load zone line of which can be connected to a first main line of the DC network and the second load zone line of which can be connected to a second main line of the DC network. In at least one embodiment of the method, a line voltage is continuously measured for each load zone line between a line potential of the load zone line and a ground potential. If a ground fault is detected on a main line of the DC network, the main lines are disconnected from the two load zone lines of one of the load zones and the ground fault is assigned to this load zone if a magnitude difference between the magnitudes of the line voltages of the two load zone lines of this load zone does not significantly decrease after the main lines have been disconnected from the load zone lines. In this case, symmetrical grounding of the two load zone lines of a load zone is understood as meaning identical grounding of the two load zone lines which, during operation without a ground fault, keeps the line potentials of the load zone lines symmetrical around the ground potential, for example resistive-capacitive grounding of the two load zone lines by way of in each case a parallel connection of a grounding capacitor and a grounding resistor with grounding capacitors of the same capacitances and grounding resistors of the same resistance values. Furthermore, it is always assumed here and below that the DC network is insulated with respect to the ground potential or is grounded via a high impedance. The connection of a load zone line to a main line of the DC network may be direct or indirect, wherein an indirect connection may be present, for example, if the DC network has a hierarchical structure with an uppermost hierarchical level, which is directly connected to the main lines, and at least one further hierarchical level, which is connected to the main lines via the hierarchical level(s) above it.

The method according to at least one embodiment of the invention uses the fact that a ground fault which affects a load zone line of a load zone causes asymmetry of the line potentials of the load zone lines with respect to the ground potential, with the result that the two line potentials are no longer symmetrical around the ground potential. If the ground fault is produced outside the load zone, for example in another load zone or directly on a main line, the symmetry of the line potentials of the load zone lines with respect to the ground potential will be established again after the main lines have been disconnected from the load zone lines of the load zone since the ground fault then no longer has an effect on the line potentials. In contrast, if the ground fault is produced in the load zone, the asymmetry of the line potentials of the load zone lines with respect to the ground potential will not change or will even slightly increase after the main lines have been disconnected from the load zone lines. In other words, after the main lines have been disconnected from the load zone lines of a load zone, the magnitude difference between the magnitudes of the line voltages of the two load zone lines of this load zone will decrease if the ground fault is produced outside the load zone and will remain the same or will increase if the ground fault is produced inside the load zone. This is used, according to at least one embodiment of the invention, to locate a ground fault detected on a main line.

In one configuration of the method, a disconnection period is predefined and the main lines are disconnected from the load zone lines of a load zone for the disconnection period after the ground fault has been detected on a main line. This configuration of the method uses the fact that brief disconnection of the main lines from the load zone lines of a load zone generally suffices to determine and evaluate the magnitude difference between the magnitudes of the line voltages of the two load zone lines of this load zone. Disconnection for a disconnection period in the range of 1 ms to 1 s typically suffices, for example. The briefest possible disconnection of the main lines from the load zone lines of a load zone is advantageous in order to impair the operation of the load zone by the disconnection to the slightest possible extent.

In a further configuration of the method, an absolute or relative minimum decrease is predefined and a decrease in the magnitude difference between the magnitudes of the line voltages of the two load zone lines of a load zone after they have been disconnected from the main lines is classified as significant if the decrease in the magnitude difference exceeds the minimum decrease. For example, a minimum decrease of 2% to 30%, in particular of approximately 10%, of a DC voltage which is between the main lines during normal operation of the DC network is predefined. Predefining the minimum decrease for a magnitude difference between the magnitudes of the line voltages makes it possible to quantify when a decrease in the magnitude difference after the main lines have been disconnected from the load zone lines of a load zone is considered to be significant. This makes it possible to advantageously reduce or entirely avoid ground faults being incorrectly located on account of only very slight decreases in the magnitude difference after the main lines have been disconnected from the load zone lines of a load zone.

In a further configuration of the method, after a ground fault has been detected on a main line, the main lines are disconnected in succession from the two load zone lines of different load zones until the ground fault is assigned to a load zone. This makes it possible to systematically search for a load zone in which the ground fault is produced. If the ground fault has not been assigned to a load zone after the search has been concluded, it can also be concluded that the ground fault is produced directly on that main line on which it was also detected.

A DC network according to at least one embodiment of invention comprises:
  two main lines,
  a plurality of load zones each having a first load zone line, which can be connected to a first main line of the DC network via a first switch, and a second load zone line, which can be connected to the second main line of the DC network via a second switch,
  a measurement unit for each load zone line, which measurement unit is configured to continuously measure a line voltage between a line potential of the load zone line and a ground potential,
  a ground fault monitoring unit which is configured to detect ground faults on the main lines,
  a control unit for controlling the switches, which control unit is configured to disconnect the main lines from the two load zone lines of a load zone, if a ground fault is detected on a main line of the DC network by the ground fault monitoring unit, by opening the switches connecting the load zone lines to the main lines, and an evaluation unit for evaluating the measurement signals from the measurement units, which evaluation unit is configured to assign a ground fault detected by the ground fault monitoring unit to that load zone which has the load zone lines disconnected from the main lines if a magnitude difference between the magnitudes of the line voltages of the two load zone lines of this load zone does not significantly decrease after the main lines have been disconnected from the load zone lines.

For example, the first switch or the second switch of each load zone is an electronic switch or both switches are electronic switches.

Furthermore, the control unit may be configured to disconnect the main lines from the load zone lines of a load zone, only for a predefined disconnection period, for example for a disconnection period in the range of 1 ms to 1 s, after a ground fault has been detected on a main line.

Furthermore, the evaluation unit may be configured to classify a decrease in the magnitude difference between the magnitudes of the line voltages of the two load zone lines of a load zone after the main lines have been disconnected from these load zone lines as significant if the decrease in the magnitude difference exceeds a predefined minimum decrease.

A DC network according to at least one embodiment of the invention makes it possible to carry out the method according to at least one embodiment of the invention with the advantages which have already been mentioned above.

FIG. 1 schematically shows an example embodiment of a DC network 1, to which a plurality of load zones 3, 5 can be connected. The DC network 1 is insulated with respect to a ground potential or is grounded via a high impedance.

The DC network 1 has two electrical main lines 7, 9, a connection unit 10, 12 for each load zone 3, 5 as well as a control unit 13, a ground fault monitoring unit 15 and an evaluation unit 17.

FIG. 1 illustrates two load zones 3, 5 by way of example. Each load zone 3, 5 has an electrical load 19, 21, for example an electrical machine and a power converter connected upstream of the electrical machine on the network side.

A first main line 7 is at a first DC voltage potential of the DC network 1. The second main line 9 is at a second DC voltage potential of the DC network 1.

Each connection unit 10, 12 is assigned to a load zone 3, 5 which can be connected to the DC network 1 via the connection unit 10, 12.

The control unit 13 is connected to the connection units 10, 12, to the ground fault monitoring unit 15 and to the evaluation unit 17. The connection of the load zones 3, 5 is controlled by the control unit 13.

The ground fault monitoring unit 15 is configured to detect ground faults on the main lines 7, 9. For this purpose, the ground fault monitoring unit 15 is connected to each main line 7, 9 and is configured to measure the voltages between the ground potential and the DC voltage potentials at which the main lines 7, 9 lie. Furthermore, the ground fault monitoring unit 15 is configured to report a detected ground fault to the control unit 13.

The evaluation unit 17 is connected to the control unit 13 and to the connection units 10, 12 and is configured to evaluate line voltages of the load zones 3, 5 in a manner described in more detail below.

Figure 2:
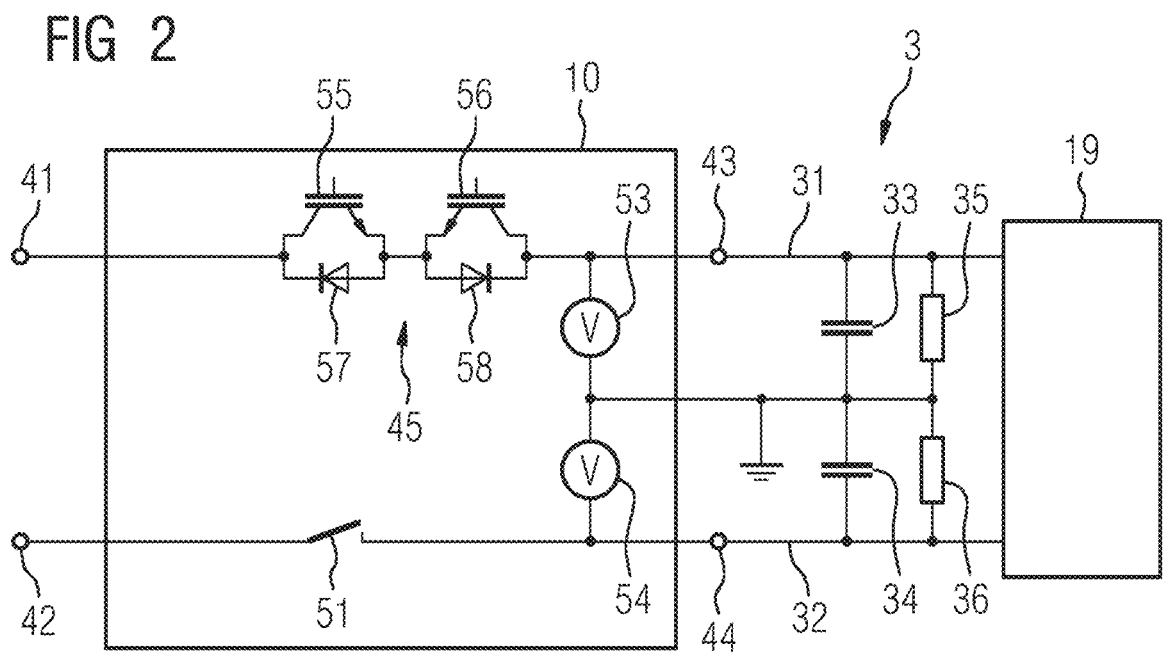
FIG. 2 shows a block diagram of a load zone and a connection unit which can be used to connect the load zone to the DC network.

FIG. 2 shows, by way of example, a block diagram of the load zone 3 and the connection unit 10 which can be used to connect the load zone 3 to the DC network 1.

The load zone 3 has a first load zone line 31 which is grounded in a resistive-capacitive manner with high impedance via a parallel connection of a first grounding capacitor 33 and a first grounding resistor 35. The load zone 3 also has a second load zone line 32 which is grounded in a resistive-capacitive manner with high impedance via a parallel connection of a second grounding capacitor 34 and a second grounding resistor 36. In this case, the two load zone lines 31, 32 are symmetrically grounded, wherein the grounding capacitors 33 have identical capacitances and the grounding resistors 35, 36 have identical resistance values in order to keep load zone potentials, at which the load zone lines 31, 32 lie, symmetrical with respect to the ground potential during fault-free operation.

The connection unit 10 has two connections 41, 42 on the network side, two connections 43, 44 on the load zone side, two switches 45, 51 and two measurement units 53, 54.

A first connection 41 on the network side is connected to the first main line 7. The second connection 42 is connected to the second main line 9. A first connection 43 on the load zone side is connected to the first load zone line 31. The second connection 44 on the load zone side is connected to the second load zone line 32.

A first switch 45 is connected between the first connection 41 on the network side and the first connection 43 on the load zone side. The first switch 45 is an electronic switch having two semiconductor switches 55, 56 which can be turned off and two diodes 57, 58. The semiconductor switches 55, 56 are reverse-connected in series, that is to say the semiconductor switches 55, 56 are connected in series, but with mutually opposite forward directions. Each diode 57, 58 is reverse-connected in parallel with one of the semiconductor switches 55, 56. The first switch 45 is in the form of a fast switch which can turn off short-circuit currents.

The second switch 51 is connected between the second connection 42 on the network side and the second connection 44 on the load zone side. The second switch 51 is a mechanical load disconnecting switch, for example. Alternatively, the second switch 51 may also be in the form of an electronic switch, like the first switch 45. The first switch 45 (or its semiconductor switches 55, 56) and the second switch 51 can be controlled by the control unit 13.

A first measurement unit 53 is configured to continuously measure a first line voltage, which is assigned to the first load zone line 31, between the line potential of the first load zone line 31 and the ground potential. The second measurement unit 54 is configured to continuously measure a second line voltage, which is assigned to the second load zone line 32, between the line potential of the second load zone line 32 and the ground potential. The measurement units 53, 54 transmit the measurement signals captured by them to the evaluation unit 17.

The second load zone 5 (and each further load zone which can be connected to the DC network 1) likewise has two symmetrically grounded load zone lines 31, 32 and can be connected to the DC network 1 via a connection unit 12 designed like the connection unit 10.

According to an embodiment of the invention, if a ground fault is detected on a main line 7, 9 of the DC network 1, both main lines 7, 9 are disconnected from the load zone lines 31, 32 of load zone 3, 5 which are connected to them by opening, in a manner initiated by the control unit 13, the switches 45, 51 connecting the load zone lines 31, 32 to the main lines 3, 5 for a predefined short disconnection period, for example for a disconnection period in the range of 1 ms to 1 s.

After the main lines 7, 9 have been disconnected from the load zone lines 31, 32 of a load zone 3, 5, the evaluation unit 17 checks whether a magnitude difference between the magnitudes of the line voltages of the two load zone lines 31, 32 of this load zone 3, 5 does not significantly decrease or whether the magnitudes of the line voltages of the two load zone lines 31, 32 converge. If the magnitude difference does not significantly decrease, the evaluation unit 17 assigns the ground fault to this load zone 3, 5.

Provision may also be made, after a ground fault has been detected on a main line 7, 9, for the main lines 7, 9 to be disconnected in succession from the two load zone lines 31, 32 of different load zones 3, 5 in each case for a predefined disconnection period until the ground fault is assigned to a load zone 3, 5.

The main lines 7, 9 are preferably disconnected from the load zone lines 31, 32 of a load zone 3, 5 at a time at which the load 19, 21 of the load zone 3, 5 does not require any energy or the required energy can be buffered for the disconnection period, for example via a storage capacitor (not illustrated) which is connected between the load zone lines 31, 32 of the load zone 3, 5.

The example embodiments of the method according to an embodiment of the invention and of a DC network 1 according to the invention which have been described on the basis of the figures can be modified in various ways to form further example embodiments. For example, provision may be made for the evaluation unit 17 to be integrated in the control unit 13 or in the ground fault monitoring unit 15. Alternatively, provision may be made for a local evaluation unit 17 to be provided for each connection unit 10, 12 instead of a superordinate evaluation unit 17, which local evaluation unit evaluates the line voltages of the load zone lines 31, 32 of the connection unit 10, 12. Provision may be additionally made for each connection unit 10, 12 to have a local control unit 13 which is configured, if a ground fault is detected on a main line 7, 9 of the DC network 1, to open the switches 45, 51 of the connection unit 10, 12 for a disconnection period. In this case too, a local evaluation unit 17 may be integrated in the local control unit 13.

Although the invention has been described and illustrated more specifically in detail by way of preferred example embodiments, the invention is not restricted by the disclosed examples and other variations can be derived therefrom by a person skilled in the art without departing from the scope of protection of the invention.

The invention claimed is:

1. A method for locating a ground fault in a DC network, to which a plurality of load zones are connectable, wherein each respective load zone of the plurality of load zones includes two symmetrically grounded load zone lines, a first load zone line of the two symmetrically grounded load zone lines being connectable to a first main line of the DC network and a second load zone line of the two symmetrically grounded load zone lines being connectable to a second main line of the DC network, the method comprising:

continuously measuring a respective line voltage for each respective load zone line between a line potential of the respective load zone line and a ground potential, and disconnecting the respective first main line and the second main line of the DC network, upon the a ground fault being detected on the first main line and the second main line of the DC network, from the first load zone line and second load zone line of a respective load zone; and assigning the ground fault to the respective load zone upon a magnitude difference between magnitudes of line voltages of the first load zone line and second zone line of the respective load zone not significantly decreasing after the respective first main line and the second main line of the DC network being disconnected, during the disconnecting, from the first load zone line and second load zone line of the respective load zone.

2. The method of claim 1, wherein a disconnection period is defined and the first main line and the second main line of the DC network are disconnected from the first load zone line and second load zone line of the respective load zone for the disconnection period after the ground fault has been detected on the first main line and the second main line of the DC network.

3. The method of claim 2, wherein the disconnection period in a range of 1 ms to 1 s is defined.

4. The method of claim 1, wherein each respective main line of the first main line and the second main line of the DC network is disconnected from the connected first load zone line and second load zone line of the respective load zone by opening a switch arranged between the respective main line of the first main line and the second main line of the DC network and the connected first load zone line and second load zone line of the respective load zone.

5. The method of claim 1, wherein an absolute or relative minimum decrease is defined and a decrease in the magnitude difference between magnitudes of the line voltages of the first load zone line and second load zone line of the respective load zone after the respective main line of the first main line and the second main line of the DC network have been disconnected, is classified as significant upon the decrease in the magnitude difference exceeding the minimum decrease.

6. The method of claim 1, wherein, after the ground fault has been detected on the first main line or the second main line of the DC network, the respective first main line and the second main line of the DC network are disconnected in succession from the first load zone line and second load zone line of different load zones until the ground fault is assigned to the load zone.

7. A DC network, comprising:
two main lines;
a plurality of load zones, each of the plurality of load zones including a first load zone line, connectable to a first main line of the DC network via a first switch, and a second load zone line connectable to a second main line of the DC network via a second switch;
a measurement unit for each of the first load zone line and second load line, configured to continuously measure a line voltage between a line potential of the first load zone line and a ground potential and between a line potential of the second load zone line and the ground potential, and generate measurement signals;
a ground fault monitoring unit configured to detect ground faults on the first main line of the DC network and the second main line of the DC network;
a control unit, to control the first and second switches, configured to disconnect the first main line of the DC network and the second main line of the DC network from the first load zone line and second load zone line of a respective load zone, upon a ground fault being detected on the first main line of the DC network and the second main line of the DC network by the ground fault monitoring unit, by opening the first and second switches connecting the first main line of the DC network and the second main line of the DC network to the first load zone line and second load zone line of a respective load zone; and an evaluation unit, to evaluate the measurement signals from the measurement unit, configured to assign the ground fault detected by the ground fault monitoring unit to the respective load zone including the first load zone line and second load zone line of the respective load zone disconnected from the first main line of the DC network and the second main line of the DC network upon a magnitude difference between magnitudes of the line voltages of the first load zone line and second load zone line of the respective load zone not significantly decreasing after the first main line of the DC network and the second main line of the DC network being disconnected from the first load zone line and second load zone line of the respective load zone.

8. The DC network of claim 7, wherein at least one of the first switch and the second switch of each respective load zone of the plurality of load zones is an electronic switch.

9. The DC network of claim 7, wherein the control unit is configured to disconnect the first main line and second main line from the first load zone line and second load zone line of the respective load zone of the plurality of load zones after the ground fault has been detected on the first main line or the second main line.

10. The DC network of claim 7, wherein the evaluation unit is configured to classify a decrease in the magnitude difference between magnitudes of the line voltages of the first load zone and second load zone line of the respective load zone after the have been disconnected from the first load zone line and second load zone line of the respective load zone as significant, the decrease in the magnitude difference exceeding a minimum decrease.

11. The method of claim 2, wherein each respective main line of the first main line and the second main line of the DC network is disconnected from the connected first load zone line and second load zone line of the respective load zone by opening a switch arranged between the respective main line of the first main line and the second main line of the DC network and the connected first load zone line and second load zone line of the respective load zone.

12. The method of claim 3, wherein each respective main line of the first main line and the second main line of the DC network is disconnected from the connected first load zone line and second load zone line of the respective load zone by opening a switch arranged between the respective main line of the first main line and the second main line of the DC network and the connected first load zone line and second load zone line of the respective load zone.

13. The method of claim 2, wherein an absolute or relative minimum decrease is defined and a decrease in the magnitude difference between magnitudes of the line voltages of the first load zone line and second load zone line of the respective load zone after the respective main line of the first main line and the second main line of the DC network have been disconnected, is classified as significant upon the decrease in the magnitude difference exceeding the minimum decrease.

14. The method of claim 2, wherein, after the ground fault has been detected on the first main line or the second main line of the DC network, the respective first main line and the second main line of the DC network are disconnected in succession from the first load zone line and second load zone line of different load zones until the ground fault is assigned to the load zone.

15. The DC network of claim 8, wherein the control unit is configured to disconnect the first main line and second main line from the first load zone line and second load zone line of the respective load zone of the plurality of load zones after the ground fault has been detected on the first main line or the second main line.

16. The DC network of claim 8, wherein the evaluation unit is configured to classify a decrease in the magnitude difference between magnitudes of the line voltages of the first load zone line and second load zone line of the respective load zone after the first main line of the DC network and the second main line of the DC network have been disconnected from the first load zone line and second load zone line of the respective load zone as significant, upon the decrease in the magnitude difference exceeding a minimum decrease.

* * * * *